US012635185B2

(12) United States Patent
Seo et al.

(10) Patent No.: US 12,635,185 B2
(45) Date of Patent: May 19, 2026

(54) THIN FILM TRANSISTOR SUBSTRATE AND DISPLAY APPARATUS COMPRISING THE SAME

(71) Applicants: LG Display Co., Ltd., Seoul (KR); Hanyang University Industry-University Cooperation Foundation, Seoul (KR)

(72) Inventors: JungSeok Seo, Paju-si (KR); Jin Seong Park, Paju-si (KR); Jaeyoon Park, Paju-si (KR); Ki Lim Han, Paju-si (KR); Taewon Hwang, Paju-si (KR); Won-Bum Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 376 days.

(21) Appl. No.: 18/127,408

(22) Filed: Mar. 28, 2023

(65) Prior Publication Data

US 2023/0317855 A1     Oct. 5, 2023

(30) Foreign Application Priority Data

Mar. 29, 2022    (KR) ........................ 10-2022-0038891
Nov. 14, 2022    (KR) ........................ 10-2022-0151606

(51) Int. Cl.
     *H01L 29/786*      (2006.01)
     *H01L 29/417*      (2006.01)
             (Continued)

(52) U.S. Cl.
     CPC ..... *H10D 30/6755* (2025.01); *H10D 30/6729* (2025.01); *H10K 59/1213* (2023.02)

(58) Field of Classification Search
     CPC ............... H10D 30/6755; H10D 30/67; H10D 30/6729; H10D 30/6739; H10D 86/423;
                 (Continued)

(56) References Cited

U.S. PATENT DOCUMENTS 8,389,991 B2 *   3/2013   Morosawa ......... H10D 30/6755
                                             257/43
9,711,652 B2 *   7/2017   Yamazaki ............ H10D 64/691
             (Continued)

FOREIGN PATENT DOCUMENTS

KR        10-0469126 B1     1/2005
KR    10-2006-0035506 A     4/2006
            (Continued)

OTHER PUBLICATIONS

EEsemi, "Properties of SiO2 and Si3N4 at 300K" at https://eesemi.com/sio2si3n4.htm (Year: 2021).*

(Continued)

*Primary Examiner* — Nikolay K Yushin
(74) *Attorney, Agent, or Firm* — Morgan, Lewis & Bockius LLP

(57)           ABSTRACT

A thin film transistor substrate and a display apparatus including the same includes a substrate; an active layer and a gate electrode on the substrate, the active layer and gate electrode being spaced apart from each other vertically; a gate insulating film including a first gate insulating film and a second gate insulating film provided between the active layer and the gate electrode; and a source electrode and a drain electrode, each of the source electrode and the drain electrode connected to the active layer. The first gate insulating film is provided closer to the gate electrode than the second gate insulating film, a dielectric constant of the first gate insulating film is higher than a dielectric constant of the second gate insulating film, and a hydrogen content of the first gate insulating film is lower than a hydrogen content of the second gate insulating film.

19 Claims, 16 Drawing Sheets

(51) Int. Cl.
    *H10D 30/67*          (2025.01)
    *H10K 59/121*       (2023.01)

(58) Field of Classification Search
    CPC .... H10D 86/40; H10D 86/60; H10K 59/1213;
              H10K 59/121; H10K 59/1216; H10K
                          59/126; H10K 59/124
    See application file for complete search history.

(56)                  References Cited

U.S. PATENT DOCUMENTS

| | | | |
|---|---|---|---|
| 10,153,131 | B2 * | 12/2018 | Kato .................... H01J 37/3244 |
| 10,340,320 | B2 * | 7/2019 | Lee ...................... H10D 86/421 |
| 2003/0228770 | A1 | 12/2003 | Lee et al. |
| 2011/0140116 | A1 * | 6/2011 | Morosawa ......... H10D 30/6739 |
| | | | 257/E29.273 |
| 2012/0181533 | A1 | 7/2012 | Yoo et al. |
| 2014/0217396 | A1 | 8/2014 | Imamura et al. |
| 2016/0027926 | A1 * | 1/2016 | Yamazaki ............ H10D 64/691 |
| | | | 257/43 |
| 2017/0287677 | A1 * | 10/2017 | Kato ................... H01J 37/3244 |
| 2018/0175127 | A1 * | 6/2018 | Lee ...................... H10D 86/421 |

FOREIGN PATENT DOCUMENTS

| | | |
|---|---|---|
| KR | 10-2012-0084133 A | 7/2012 |
| KR | 10-2013-0092591 A | 8/2013 |

OTHER PUBLICATIONS

Kim et al., "Plasma-Enhanced Atomic-Layer-Deposited Sio2 and Sion Thin Films at Low Temperature (< 300° C) Using ICP Type Remote Plasma for 3-Dimensional Electronic Devices," Journal of the Semiconductor & Display Technology, vol. 18, No. 2, Jun. 2019, pp. 98-102.

* cited by examiner

FIG. 16

| | $SiN_X$ G.I | 2.5 nm stack | 5 nm stack | 7.5 nm stack | $SiO_2$ G.I |
|---|---|---|---|---|---|
| $SiO_2$ / $SiN_X$ ratio | 0% | 6.3% | 12.5% | 18.8% | 100% |
| $V_{th}$ [V] | $1.02 \pm 0.25$ | $0.47 \pm 0.06$ | $0.40 \pm 0.02$ | $0.52 \pm 0.07$ | $0.64 \pm 0.16$ |
| Hysteresis [V] (@$V_{DS} = 0.1V$) | $1.45 \pm 0.14$ | $0.49 \pm 0.04$ | $0.36 \pm 0.05$ | $0.36 \pm 0.05$ | $0.20 \pm 0.07$ |
| $\mu_{sat}$ [cm2/Vs] | $26.77 \pm 0.89$ | $26.93 \pm 0.32$ | $22.24 \pm 0.39$ | $22.91 \pm 0.51$ | $18.07 \pm 0.81$ |
| S.S. [V/decade] | $0.23 \pm 0.01$ | $0.21 \pm 0.01$ | $0.21 \pm 0.01$ | $0.26 \pm 0.01$ | $0.30 \pm 0.02$ |
| Dielectric constant (k) | 6.4 | 6.3 | 6.2 | 6.1 | 4.0 |

FIG. 18

| | $Si_{nX}$ G.I | 2.5 nm stack | 5 nm stack | 7.5 nm stack | $SiO_2$ G.I |
|---|---|---|---|---|---|
| $\Delta V_{th}$ [V] | 2.70 | 0.67 | 0.48 | -0.69 | 0.74 |
| $\Delta$S.S. [V/decade] | 0.04 | 0.03 | 0.00 | 0.02 | 0.05 |

THIN FILM TRANSISTOR SUBSTRATE AND DISPLAY APPARATUS COMPRISING THE SAME

CROSS-REFERENCE TO RELATED APPLICATIONS

This application claims the benefit of the Korean Patent Applications Nos. 10-2022-0038891 filed on Mar. 29, 2022, and 10-2022-0151606 filed on Nov. 14, 2022, which is hereby incorporated by reference as if fully set forth herein.

BACKGROUND

Technical Field

The present disclosure relates to a thin film transistor substrate and a display apparatus comprising the same.

Discussion of the Related Art

Since a thin film transistor may be manufactured on a glass substrate or a plastic substrate, it is widely used as a switching element or a driving element of a display device such as a liquid crystal display device or an organic light emitting device.

The thin film transistor includes a gate electrode, an active layer, and a gate insulating film that insulates the gate electrode from the active layer.

In general, silicon oxide or silicon nitride is used as the gate insulating film. However, silicon oxide is difficult to apply to thin film transistors driven at low voltages due to its low dielectric constant, and silicon nitride has a high dielectric constant, but it contains a large amount of hydrogen, so a large amount of hydrogen penetrates into the active layer during the manufacturing process.

SUMMARY

Accordingly, embodiments of the present disclosure are directed to a a thin film transistor substrate and a display apparatus comprising the same that substantially obviate one or more of the problems due to limitations and disadvantages of the related art.

An aspect of the present disclosure to provide a thin film transistor substrate including a gate insulating film having a high dielectric constant and a low hydrogen content, and a display device including the same.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a thin film transistor substrate comprises a substrate; an active layer and a gate electrode on the substrate, the active layer and gate electrode being spaced apart from each other vertically: a gate insulating film including a first gate insulating film and a second gate insulating film provided between the active layer and the gate electrode; and a source electrode and a drain electrode, each of the source electrode and the drain electrode connected to the active layer, wherein the first gate insulating film is provided closer to the gate electrode than the second gate insulating film, and a dielectric constant of the first gate insulating film is higher than a dielectric constant of the second gate insulating film, and a hydrogen content of the first gate insulating film is lower than a hydrogen content of the second gate insulating film, and a display apparatus including the same.

In another aspect, a thin film transistor substrate comprises a substrate: an active layer and a gate electrode on the substrate, the active layer and gate electrode being spaced apart from each other vertically: a gate insulating film provided between the active layer and the gate electrode; and a source electrode and a drain electrode, each of the source electrode and the drain electrode connected to the active layer, wherein the gate insulating film includes silicon nitride formed by plasma-enhanced atomic layer deposition using disopropyl amino silane gas as a source gas, and a display apparatus including the same.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings:

FIG. 16 is a table showing various characteristic values of a silicon nitride single layer according to the present disclosure, a double layer of silicon oxide and silicon nitride, and a thin film transistor using the conventional silicon oxide single layer as a gate insulating film.

FIG. 18 is a table showing various characteristic values of a silicon nitride single layer according to the present disclosure, a double layer of silicon oxide and silicon nitride, and a thin film transistor using the conventional silicon oxide single layer as a gate insulating film.

DETAILED DESCRIPTION

Figure 1:
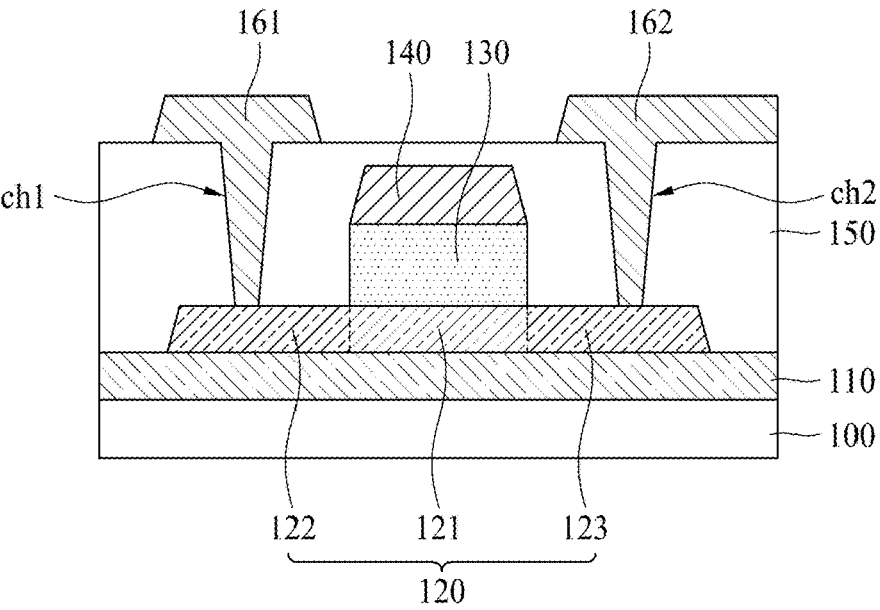
FIG. 1 is a schematic cross-sectional view of a thin film transistor substrate according to an embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween may be included, unless "just" or "direct" is used.

If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically The embodiments of the present disclosure may be carried out independently from each other, or may be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

FIG. 1 is a schematic cross-sectional view of a thin film transistor substrate according to an embodiment of the present disclosure.

Referring to FIG. 1, the thin film transistor substrate according to an embodiment of the present disclosure may include a substrate 100, a buffer layer 110, an active layer 120, a gate insulating film 130, a gate electrode 140, an interlayer insulating film 150, a source electrode 161, and a drain electrode 162.

The substrate 100 may be formed of glass or plastic. If using plastic for the substrate 100, transparent plastic having flexibility, for example, polyimide may be used. If the substrate 100 is formed of polyimide, heat resistant polyimide capable of enduring a high temperature may be used in consideration of a high temperature deposition process on the substrate 100.

The buffer layer 110 is formed on the substrate 100. The buffer layer 110 may protect the active layer 120 by blocking air and moisture. The buffer layer 110 may be formed of an inorganic insulating material such as silicon oxide, silicon nitride, or metal oxide, but is not limited thereto and may be formed of an organic insulating material. The buffer layer 110 may be formed of a single layer or a plurality of layers.

The active layer 120 is formed on the buffer layer 110. The active layer 120 may include a channel portion 121, a first connection portion 122, and a second connection portion 123. The first connection portion 122 may be connected to one side of the channel portion 121, and the second connection portion 123 may be connected to the other side of the channel portion 121. The channel portion 121 may be made of a semiconductor material and may overlap the gate electrode 140 to be protected by the gate electrode 140. The first connection part 122 and the second connection part 123 may be exposed to plasma and conductive when patterning the gate insulating film 130 using the gate electrode 140 as a mask by a dry etching process. In some cases, the first connection part 122 and the second connection part 123 may be conducted by a separate ion doping process after patterning the gate insulating film 130.

The first connection part 122 and the second connection part 123 may not overlap the gate electrode 140. The first connection part 122 and the second connection part 123 have better conductivity than the channel part 121, and may each serve as a wiring or source/drain electrode.

The active layer 120 may include a semiconductor material, for example, an oxide semiconductor material. The oxide semiconductor material may include at least, for example, one of IZO (InZnO)-based oxide semiconductor, IGO (InGaO)-based oxide semiconductor, ITO (InSnO)-based oxide semiconductor, IGZO (InGaZnO)-based oxide semiconductor, IGZTO (InGaZnSnO)-based oxide semiconductor, GZTO (GaZnSnO)-based oxide semiconductor, GZO (GAZnO)-based semiconductor, ITZO (InSnZnO)-based semiconductor, and FIZO (FeInZnO)-based oxide semiconductor. The active layer (120) may be formed by metal organic atomic layer deposition (MOALD).

The gate insulating film 130 is formed on the active layer 120. The gate insulating film 130 may be provided between the active layer 120 and the gate electrode 140 and may be formed in the same pattern as the gate electrode 140.

The gate insulating film 130 may include a high dielectric constant material, particularly a material having a high dielectric constant of 6 to 8. More specifically, the gate insulating film 130 may include a material having a dielectric constant of 6.1 to 6.7. Since the gate insulating film 130 includes a material having a high dielectric constant, a relatively high driving current value can be obtained even at a low voltage, and thus it can be easily used as a switching element of a high-resolution display for driving a low voltage.

The gate insulating film 130 may include a material having a low hydrogen content. If the gate insulating film 130 contains a lot of hydrogen, hydrogen may penetrate into the active layer 120 in a subsequent process to form an excessive amount of electron carrier in the active layer 120, which may not perform the switching function of the thin film transistor. Accordingly, it may be preferable that the gate insulating film 130 contains a hydrogen content of 8 atomic % or less.

As described above, the gate insulating film 130 having a high dielectric constant and a low hydrogen content may include silicon nitride. The silicon nitride used in the gate insulating film 130 may be formed by atomic layer deposition, particularly, plasma enhanced atomic layer deposition (PEALD). The silicon nitride formed by the plasma enhanced atomic layer deposition method has high-density characteristics and a low internal defect state, thereby providing excellent film quality of the gate insulating film 130.

The gate electrode 140 is formed on the gate insulating film 130. The gate electrode 140 may be formed to overlap the active layer 120, particularly, the channel portion 121 of the active layer 120.

The interlayer insulating film 150 is formed on the gate electrode 140. The interlayer insulating film 150 insulates between the gate electrode 140 and the source electrode 161 and between the gate electrode 140 and the drain electrode 162. The interlayer insulating film 150 may include a single layer or a plurality of layers including an inorganic insulating material and/or an organic insulating material. The interlayer insulating film 150 is provided with a first contact hole ch1 and a second contact hole ch2. Accordingly, the first connection part 122 of the active layer 120 may be exposed by the first contact hole ch1, and the second connection part 123 of the active layer 120 may be exposed by the second contact hole ch2.

The source electrode 161 and the drain electrode 162 are formed on the interlayer insulating film 150.

The source electrode 161 is electrically connected to the active layer 120, particularly, the first connection part 122, and the drain electrode 162 is electrically connected to the active layer 120, particularly, the second connection part 123. Specifically, the source electrode 161 is connected to the first connection part 122 through a first contact hole ch1 provided in the interlayer insulating film 150, and the drain electrode 162 is connected to the second connection part 123 through a second contact hole ch2 provided in the interlayer insulating film 150.

Figure 2A:
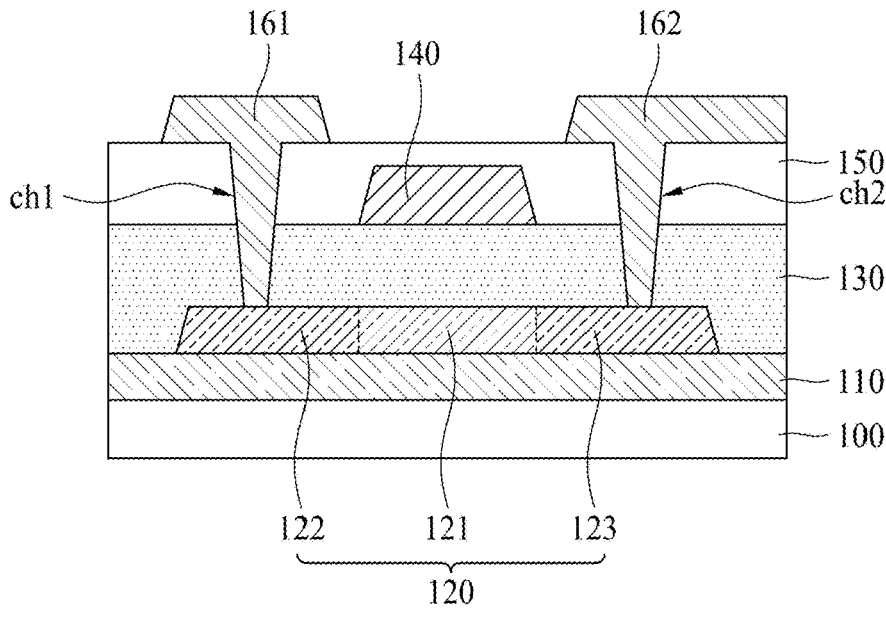
FIG. 2A is a schematic cross-sectional view of a thin film transistor substrate according to another embodiment of the present disclosure.

FIG. 2a is a schematic cross-sectional view of a thin film transistor substrate according to another embodiment of present disclosure, which is different from FIG. 1 described above in that the structure of the gate insulating film 130 is changed. Therefore, the same reference numerals are assigned to the same configuration, and only different configurations will be described below.

Referring to FIG. 2A, according to another embodiment of the present disclosure, a gate insulating film 130 is formed on the active layer 120 and extends to an upper surface of the buffer layer 110 on which the active layer 120 is not formed.

According to FIG. 1, only an interlayer insulating film 150 is formed between the source electrode 161 and the active layer 120 and between the drain electrode 162 and the active layer 120, whereas in the structure of FIG. 2, an interlayer insulating film 150 and a gate insulating film 130 are formed between the source electrode 161 and the active layer 120 and between the drain electrode 162 and the active layer 120.

Accordingly, the source electrode 161 is connected to the first connection part 122 through the first contact hole ch1 provided in the interlayer insulating film 150 and the gate insulating film 130, and the drain electrode 162 is connected to the second connection part 123 through the second contact hole ch2 provided in the interlayer insulating film 150 and the gate insulating film 130.

Meanwhile, in the case of the structure of FIG. 2A, the first connection part 122 and the second connection part 123 may be conductive by a separate ion doping process.

Figure 2B:
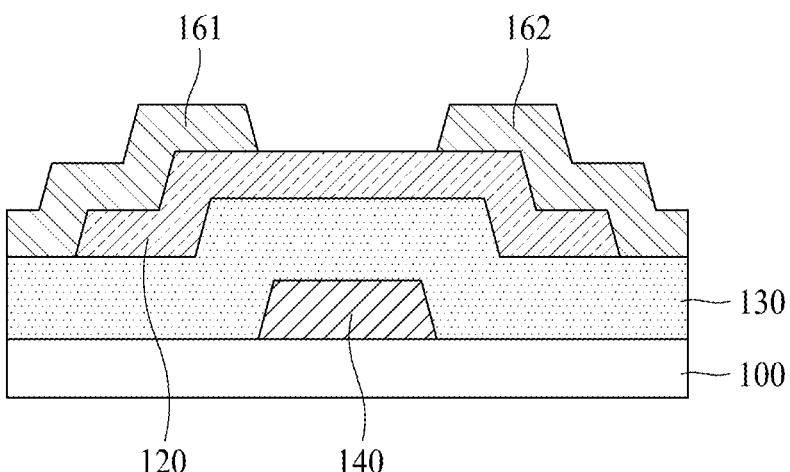
FIG. 2B is a schematic cross-sectional view of a thin film transistor substrate according to another embodiment of the present disclosure.

FIG. 2B is a schematic cross-sectional view of a thin film transistor substrate according to another embodiment of the present disclosure.

FIGS. 1 and 2A relate to a top gate structure in which the gate electrode 140 is formed above the active layer 120, and FIG. 2B relates to a bottom gate structure in which the gate electrode 140 is formed below the active layer 120.

Referring to FIG. 2B, according to another embodiment of the present disclosure, a gate electrode 140 is formed on a substrate 100, a gate insulating film 130 is formed on the gate electrode 140, an active layer 120 is formed on the gate insulating film 130, a source electrode 161 is formed on one side of the active layer 120, and a drain electrode 162 is formed on the other side of the active layer 120. A buffer layer may be added between the substrate 100 and the gate electrode 140.

The characteristics of the components of FIG. 2B are the same as those of the embodiments of FIGS. 1 and 2A, except that the active layer 120 does not include a first connection part 122 and a second connection part 123 which is conductive.

Figure 3:
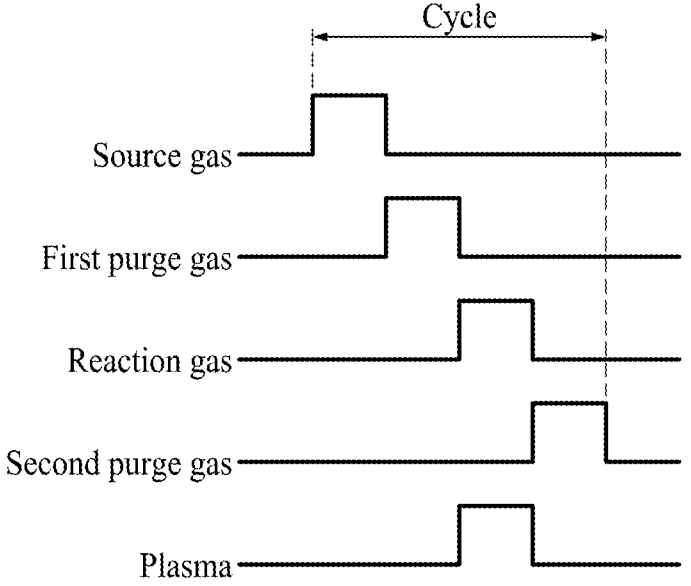
FIG. 3 illustrates a method of forming a gate insulating film according to an embodiment of the present disclosure.

FIG. 3 illustrates a method of forming a gate insulating film according to an embodiment of the present disclosure. The gate insulating film according to an embodiment of the present disclosure may be formed through a plasma-enhanced atomic layer deposition method (PEALD) using vacuum deposition equipment.

Referring to FIG. 3, a method of forming a gate insulating film according to an embodiment of the present disclosure is performed in a vacuum chamber and specifically includes a step of supplying a source gas, a step of supplying a first purge gas, a step of supplying a reactant gas, and a step of supplying a second purge gas.

The step of supplying the source gas may include a process of seating a substrate in the vacuum chamber and supplying the source gas into the vacuum chamber.

The source gas is made of a gas containing silicon (Si). The gas including silicon may be formed of silane gas, and the silane gas may include di-isopropylamino silane (DI-PAS) gas.

When the source gas is supplied, the source gas may be adsorbed on the substrate.

The step of supplying the first purge gas may be performed simultaneously while stopping the supply of the source gas. As the first purge gas, various purge gases known in the art may be used. When the first purge gas is supplied, the source gas remaining in the vacuum chamber without being adsorbed on the substrate is removed.

The step of supplying the reactant gas may be performed simultaneously while stopping the supply of the first purge gas.

The reactant gas consists of a gas containing nitrogen. The nitrogen-containing gas may be selected from N2 or NH3. When the reactant gas is supplied, silicon of the adsorbed source gas reacts with nitrogen of the reactant gas to obtain silicon nitride. When the reactant gas is supplied, plasma is formed in the vacuum chamber, and thus the silicon nitride may be more easily obtained. Plasma is formed at the same time as the supply of the reactant gas, the supply of the reactant gas is stopped, and the formation of plasma is stopped at the same time.

The step of supplying the second purge gas may be performed simultaneously while stopping the supply of the reactant gas. As the second purge gas, various purge gases known in the art may be used and may be formed of the same gas as the first purge gas, but is not limited thereto. When the second purge gas is supplied, the reactant gas that does not react and remains in the vacuum chamber is removed.

According to an embodiment of present disclosure, one cycle may be completed by a combination of the source gas, the first purge gas, the reactant gas, and the second purge gas supply, and the one cycle may be repeated to form a gate insulating film made of silicon nitride with a predetermined thickness.

Figure 4:
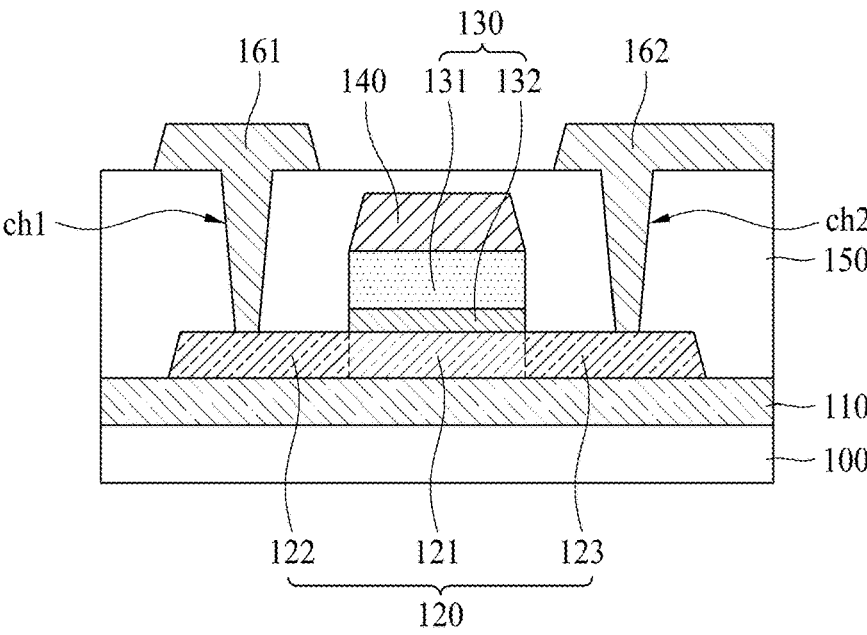
FIG. 4 is a schematic cross-sectional view of a thin film transistor substrate according to another embodiment of the present disclosure.

FIG. 4 is a schematic cross-sectional view of a thin film transistor substrate according to another embodiment of the present disclosure, which is different from FIG. 1 in that the structure of the gate insulating film 130 is changed. Therefore, the same reference numerals are assigned to the same configuration, and only different configurations will be described below.

Referring to FIG. 4, according to another embodiment of present disclosure, the gate insulating film 130 includes a first gate insulating film 131 and a second gate insulating film 132.

The first gate insulating film 131 and the second gate insulating film 132 may have the same pattern and may have the same pattern as the gate electrode 140.

The second gate insulating film 132 is provided between the active layer 120 and the first gate insulating film 131.

The second gate insulating film 132 includes a lower dielectric constant material than the first gate insulating film 131. The second gate insulating film 132 may include a material having a lower hydrogen content than the first gate insulating film 131, and thus the second gate insulating film 132 may block hydrogen included in the first gate insulating film 131 from moving to the active layer 120.

The second gate insulating film 132 may include silicon oxide. The silicon oxide used for the second gate insulating film 132 may be formed by an atomic layer deposition method, particularly, plasma enhanced atomic layer deposition (PEALD). The silicon oxide formed by the plasma enhanced atomic layer deposition method has high density characteristics and a low internal defect state, thereby providing excellent film quality of the second gate insulating film 132.

The first gate insulating film 131 is provided between the second gate insulating film 132 and the gate electrode 140.

The first gate insulating film 131 may include a high dielectric constant material, particularly a material having a high dielectric constant of 6 to 7.5. More specifically, the first gate insulating film 131 may include a material having a dielectric constant of 6.1 to 6.7. As described above, since the first gate insulating film 131 includes a material having a high dielectric constant, it may be easily used as a switching element of a high-resolution display for low-voltage driving.

The first gate insulating film 131 may include a material having a low hydrogen content. If the first gate insulating film 131 contains a lot of hydrogen, hydrogen may penetrate into the active layer 120 in a subsequent process to form an excessive amount of electron carrier in the active layer 120, which may not perform the switching function of the thin film transistor. It may be preferable that the first gate insulating film 131 contains a hydrogen content of 8 atomic % or less.

As described above, the first gate insulating film 131 having a high dielectric constant and a low hydrogen content may include silicon nitride. The silicon nitride used in the first gate insulating film 131 may be formed by atomic layer deposition, particularly, plasma enhanced atomic layer deposition (PEALD). The silicon nitride formed by the plasma enhanced atomic layer deposition method has high density characteristics and a low internal defect state, thereby providing excellent film quality of the first gate insulating film 131.

It may be desirable that the thickness of the second gate insulating film 132 is thinner than the thickness of the first gate insulating film 131 to improve the dielectric constant of the gate insulating film 130.

According to another embodiment of the present disclosure, the gate insulating film 130 includes a second gate insulating film 132 including silicon oxide and a first gate insulating film 131 including silicon nitride, thereby effectively improving hysteresis characteristics and reliability of the thin film transistor without significantly reducing dielectric constant.

In particular, the second gate insulating film 132 including the silicon oxide and the first gate insulating film 131 including the silicon nitride may be formed in an in-situ process in one vacuum chamber.

Figure 5A:
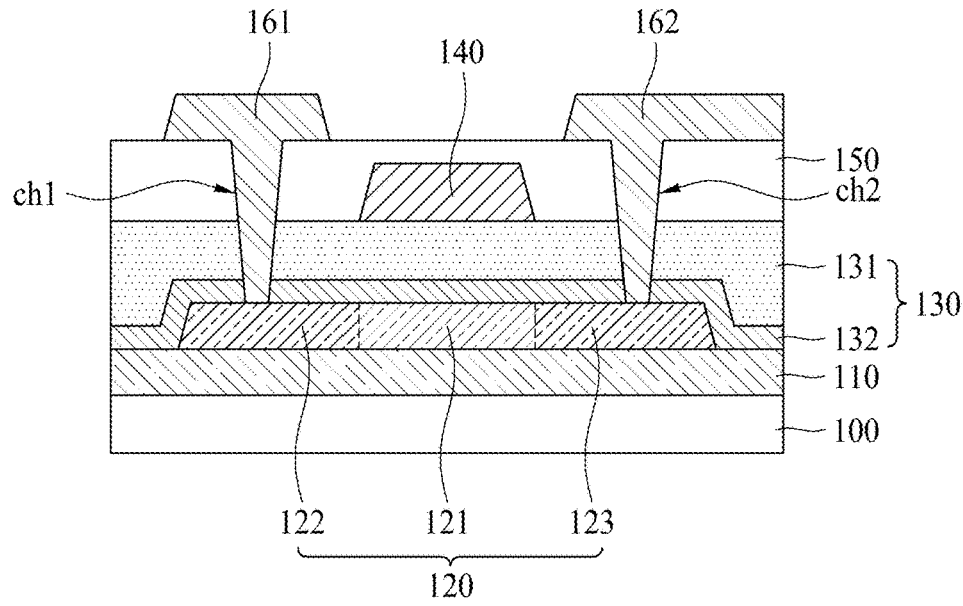
FIG. 5A is a schematic cross-sectional view of a thin film transistor substrate according to another embodiment of the present disclosure.

FIG. 5A is a schematic cross-sectional view of a thin film transistor substrate according to another embodiment of the present disclosure, which is different from FIG. 4 described above in that the structure of the gate insulating film 130 is changed. Therefore, the same reference numerals are assigned to the same configuration, and only different configurations will be described below.

Referring to FIG. 5a, according to another embodiment of present disclosure, a first gate insulating film 131 and a second gate insulating film 132 are formed on the active layer 120 and extend to an upper surface of the buffer layer 110 on which the active layer 120 is not formed.

According to FIG. 4, only an interlayer insulating film 150 is formed between the source electrode 161 and the active layer 120 and between the drain electrode 162 and the active layer 120, whereas in the structure of FIG. 5, an interlayer insulating film 150, a first gate insulating film 131 and a second gate insulating film 132 are formed between the source electrode 161 and the active layer 120 and the drain electrode 162 and the active layer 120.

Figure 5B:
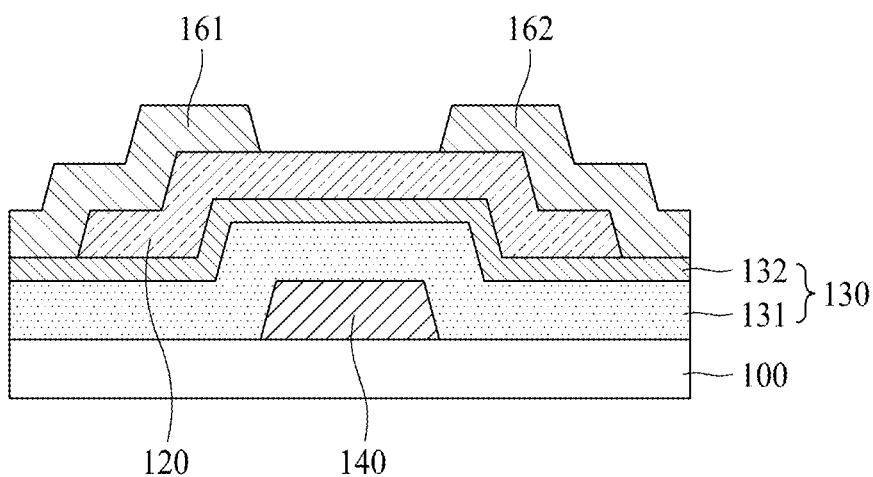
FIG. 5B is a schematic cross-sectional view of a thin film transistor substrate according to another embodiment of the present disclosure.

Accordingly, the source electrode 161 is connected to the first connection part 122 through the first contact hole ch1 provided in the interlayer insulating film 150, the first gate insulating film 131 and the second gate insulating film 132, and the drain electrode 162 is connected to the second connection part 123 through the second contact hole ch2 provided in the interlayer insulating film 150 the first gate insulating film 131 and the second gate insulating film 132. FIG. 5B is a schematic cross-sectional view of a thin film transistor substrate according to another embodiment of the present disclosure.

FIGS. 4 and 5A relate to a top gate structure in which the gate electrode 140 is formed above the active layer 120, and FIG. 5B relates to a bottom gate structure in which the gate electrode 140 is formed below the active layer 120.

Referring to FIG. 5B, according to another embodiment of the present disclosure, a gate electrode 140 is formed on a substrate 100, a first gate insulating film 131 is formed on the gate electrode 140, a second gate insulating film 132 is formed on the first gate insulating film 131, and a source electrode 161 is formed on one side of the active layer 120. and a drain electrode 162 is formed on the other side of the active layer 120. A buffer layer may be added between the substrate 100 and the gate electrode 140.

The characteristics of the components of FIG. 5B are the same as those of the embodiments of FIGS. 4 and 5A, except that the active layer 120 does not include the first connection part 122 and the second connection part 123 which is conductive.

Figure 6A:
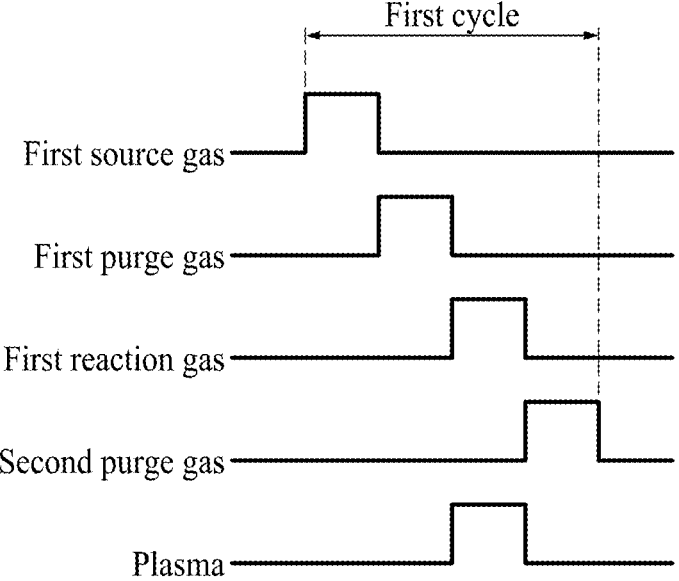
FIGS. 6A and 6B illustrate a method of forming a gate insulating film according to another embodiment of the present disclosure.
Figure 6B:
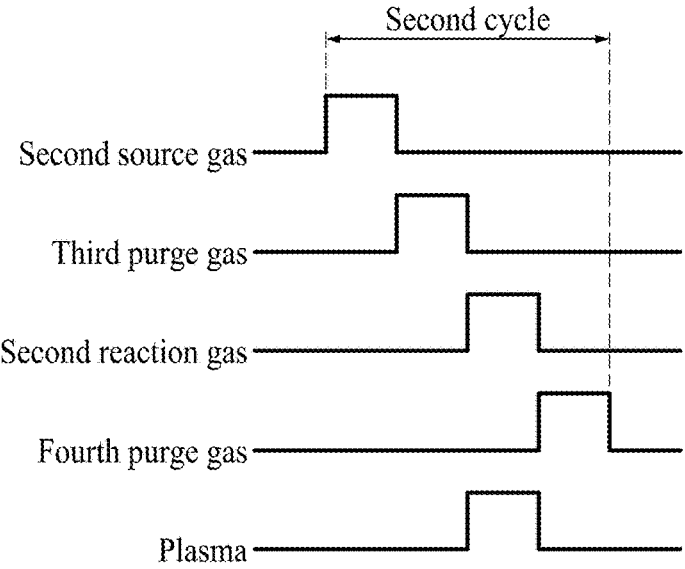

FIGS. 6A and 6B illustrate a method of forming a gate insulating film according to another embodiment of the present disclosure, and the method of forming the gate insulating film according to FIG. 4 or FIG. 5 described above. FIG. 6A relates to a process of forming a second gate insulating film 132, and FIG. 6B relates to a process of forming a first gate insulating film 131. FIGS. 6A and 6B can be carried out in a continuous process through a plasma-enhanced atomic layer deposition (PEALD) method using the same one deposition equipment.

Referring to FIG. 6A, a method of forming a second gate insulating film according to an embodiment of the present disclosure is performed in a vacuum chamber and specifically includes a step of supplying a first source gas, a step of supplying a first purge gas, a step of supplying a first reactant gas and a step of supplying a second purge gas.

The step of supplying the first source gas may include a process of seating a substrate in the vacuum chamber and supplying the first source gas into the vacuum chamber.

The first source gas is made of a gas including silicon (Si). The gas including silicon may be formed of silane gas, and the silane gas may include diisopropylamino silane (DIPAS) gas.

When the first source gas is supplied, the first source gas may be adsorbed on the substrate.

The step of supplying the first purge gas may be performed simultaneously while stopping the supply of the first source gas. As the first purge gas, various purge gases known in the art may be used. When the first purge gas is supplied, the first source gas remaining in the vacuum chamber without being adsorbed on the substrate is removed.

The step of supplying the first reactant gas may be performed simultaneously while stopping the supply of the first purge gas.

The first reactant gas is made of a gas containing oxygen. The gas containing oxygen may be selected from O2 or N2O. When the first reactant gas is supplied, silicon of the adsorbed first source gas reacts with oxygen of the first reactant gas to obtain silicon oxide. When the first reactant gas is supplied, plasma is formed in the vacuum chamber, and thus the silicon oxide may be more easily obtained. Plasma is formed at the same time as the supply of the first reactant gas, and the supply of the first reactant gas is stopped and the formation of the plasma is stopped at the same time.

The step of supplying the second purge gas may be performed simultaneously while stopping the supply of the first reactant gas. As the second purge gas, various purge gases known in the art may be used and may be formed of the same gas as the first purge gas, but is not limited thereto.

When the second purge gas is supplied, the first reactant gas that does not react and remains in the vacuum chamber is removed.

According to an embodiment of present disclosure, a first cycle may be completed by a combination of the first source gas, the first purge gas, the first reactant gas and the second purge gas, and the first cycle may be repeated to form a second gate insulating film 132 made of silicon oxide with a predetermined thickness.

Referring to FIG. 6B, the method of forming the first gate insulating film according to an embodiment of the present disclosure is performed in a vacuum chamber and specifically includes a step of supplying a second source gas, a step of supplying a third purge gas, a step of supplying a second reactant gas and a step of supplying a fourth purge gas.

The process of supplying the second source gas may be performed at the same time as stopping the above-described process of supplying the second purge gas in FIG. 6A.

The second source gas is made of a gas including silicon (Si). The gas including silicon may be formed of silane gas, and the silane gas may include diisopropylamino silane (DIPAS) gas. The second source gas may be the same as the first source gas. When the second source gas is supplied, the second source gas may be adsorbed onto the second gate insulating film 132.

The step of supplying the third purge gas may be performed simultaneously while stopping the supply of the second source gas. The third purge gas may be formed of the same gas as the first purge gas or the second purge gas. When the third purge gas is supplied, the second source gas remaining in the vacuum chamber without being adsorbed on the first gate insulating film is removed.

The step of supplying the second reactant gas may be performed simultaneously while stopping the supply of the third purge gas.

The second reactant gas is made of a gas containing nitrogen. The gas containing nitrogen may be selected from N2 or NH3. When the second reactant gas is supplied, the adsorbed silicon of the second source gas reacts with nitrogen of the second reactant gas to obtain silicon nitride. When the second reactant gas is supplied, plasma is formed in the vacuum chamber, and thus the silicon nitride may be more easily obtained. Plasma is formed at the same time as the supply of the second reactant gas, and the supply of the second reactant gas is stopped and the formation of the plasma is stopped at the same time.

The step of supplying the fourth purge gas may be performed simultaneously while stopping the supply of the second reactant gas. The fourth purge gas may be formed of at least one of the first to third purge gases. When the fourth purge gas is supplied, the second reactant gas that does not react and remains in the vacuum chamber is removed.

According to another embodiment of present disclosure, the second cycle may be completed by a combination of the steps of supplying the second source gas, supplying the third purge gas, supplying the second reactant gas and supplying the fourth purge gas, and the second cycle may be repeated to form a first gate insulating film 131 made of silicon nitride with a predetermined thickness.

Figure 7:
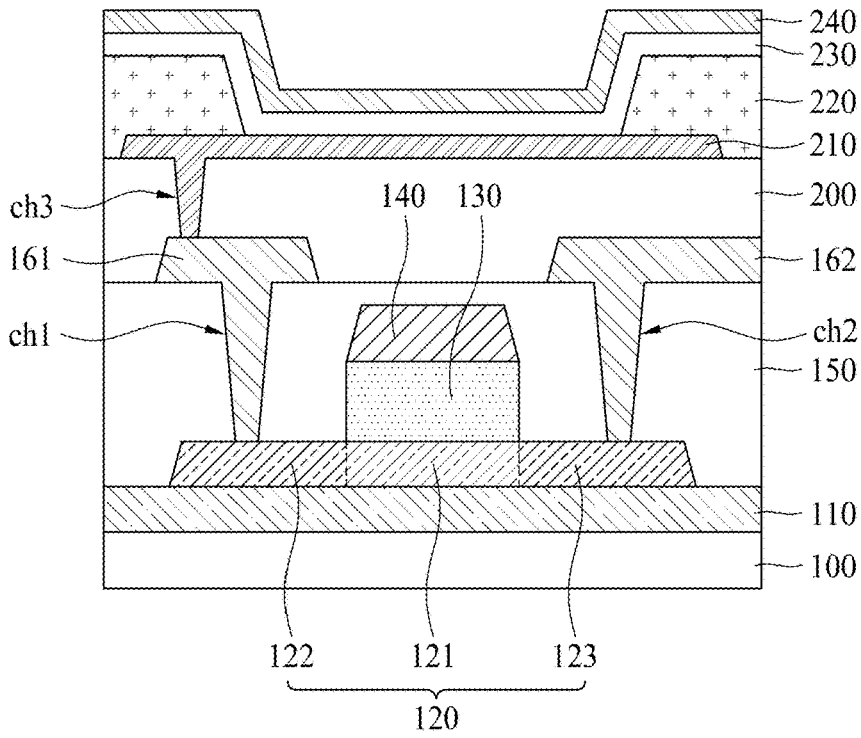
FIG. 7 is a schematic cross-sectional view of a display device according to an embodiment of the present disclosure.

FIG. 7 is a schematic cross-sectional view of a display apparatus according to an embodiment of the present disclosure.

Referring to FIG. 7, the display apparatus according to an embodiment of the present disclosure includes a substrate 100, a buffer layer 110, an active layer 120, a gate insulating film 130, a gate electrode 140, an interlayer insulating film 150, a source electrode 161, a drain electrode 162, a planarization layer 200, a bank layer 220, a light emitting layer 230, and a second electrode 240.

The substrate 100, the buffer layer 110, the active layer 120, the gate insulating film 130, the gate electrode 140, the interlayer insulating film 150, the source electrode 161, and the drain electrode 162 are the same as the aforementioned embodiments, so repeated explanations will be omitted. The gate insulating film 130 illustrates the same structure as FIG. 1 described above, but may have the structure of FIGS. 2a, 2b, FIG. 4, FIG. 5a, or FIG. 5b described above.

The planarization layer 200 is provided on the source electrode 161 and the drain electrode 162. The planarization layer 200 is provided with a third contact hole ch3, so that the source electrode 161 is exposed by the third contact hole ch3. However, in some cases, the drain electrode 162 may be exposed by the third contact hole ch3.

The first electrode 210 is formed on the planarization layer 200 and is connected to the source electrode 161 or the drain electrode 162 through the third contact hole ch3. The first electrode 210 may function as an anode.

The bank layer 220 is provided to cover an edge of the first electrode 210 to define a light emitting area. Accordingly, an upper surface area of the first electrode 210 exposed without being covered by the bank layer 220 becomes a light emitting area.

The light emitting layer 230 is provided on the first electrode 210. The light emitting layer 230 may include red, green, and blue emission layers patterned for each pixel, or may be formed of a white emission layer connected to all pixels. When the light emitting layer 230 is formed of a white light emitting layer, the light emitting layer 230 may include, for example, a first stack including a blue light emitting layer, a second stack including a yellow green light emitting layer, and a charge generating layer provided between the first stack and the second stack, but is not limited thereto.

The second electrode 240 is provided on the light emitting layer 230. The second electrode 240 may function as a cathode.

Although not shown, an encapsulation layer for preventing moisture or oxygen from penetrating may be additionally formed on the second electrode 240.

Figure 8:
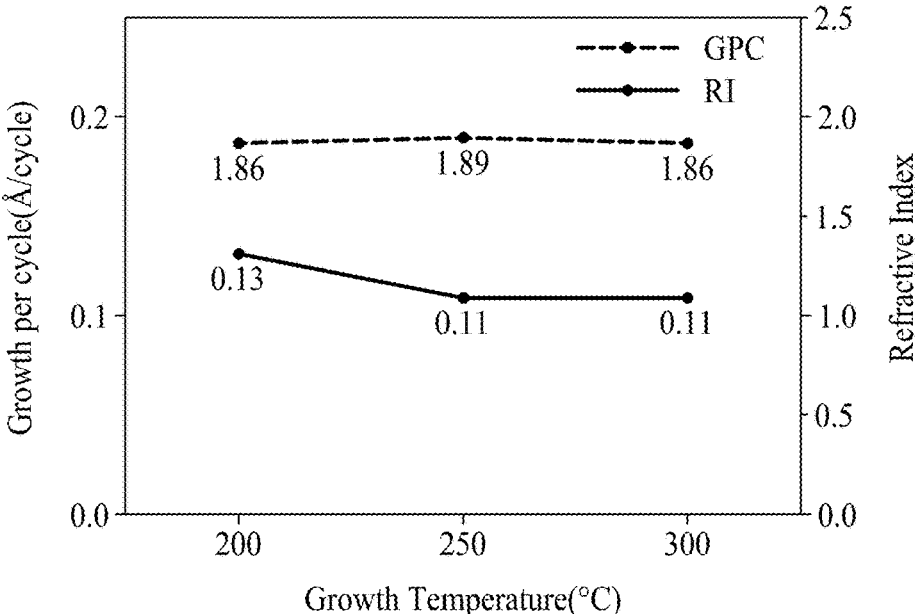
FIG. 8 is a graph showing changes in deposition thickness and refractive index according to deposition temperature of silicon nitride formed according to an embodiment of the present disclosure.
Figure 9:
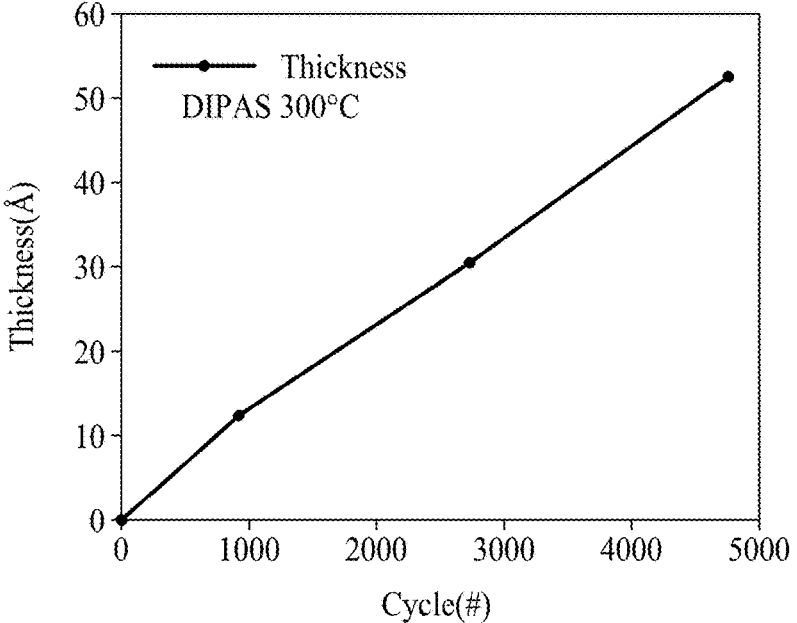
FIG. 9 is a graph showing a change in deposition thickness according to a deposition cycle of silicon nitride formed according to an embodiment of the present disclosure.

FIG. 8 is a graph showing a change in deposition thickness and refractive index per deposition cycle according to a deposition temperature of silicon nitride formed by a PEALD method according to an embodiment of the present disclosure, and FIG. 9 is a graph showing a change in deposition thickness according to a deposition cycle of silicon nitride formed according to an embodiment of the present disclosure.

FIGS. 8 and 9 relate to a silicon nitride prepared by using diisopropylamino silane (DIPAS) gas as a source gas and nitrogen gas as a reactant gas in the process according to FIG. 3.

Referring to FIG. 8, as the deposition temperature changes from 200° C. to 300° C., there is no significant difference in the thin film growth rate for each deposition cycle, and the refractive index is constant without a significant difference. Therefore, it may be seen that the deposition of PEALD according to the present disclosure may be easily performed in a temperature range of 200° C. to 300° C.

FIG. 9 shows the deposition of silicon nitride at a deposition temperature of 300° C., and as shown in FIG. 9, it may be seen that the thin film was smoothly deposited from a constant increase in thickness as the deposition cycle is repeated.

Figure 10:
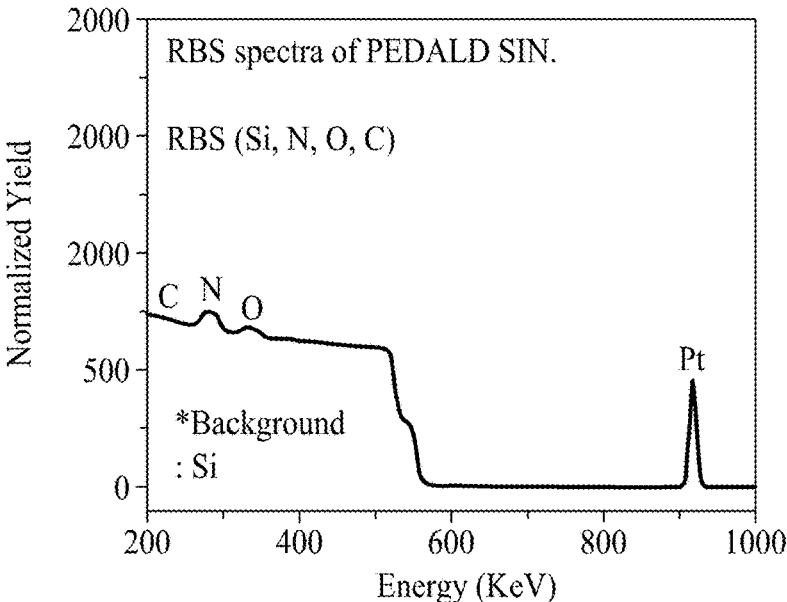
FIG. 10 is an RBS (Rutherford Backscattering Spectrometry) analysis graph of silicon nitride formed according to an embodiment of the present disclosure.
Figure 11:
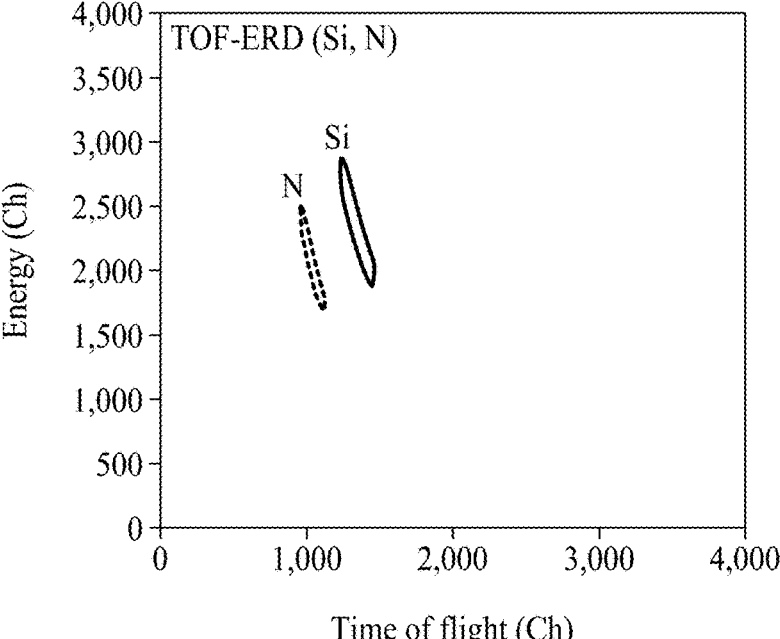
FIG. 11 is a TOF (time of flight)-ERD (Elastic Recoil Detection) analysis graph of silicon nitride formed according to an embodiment of the present disclosure.
Figure 12:
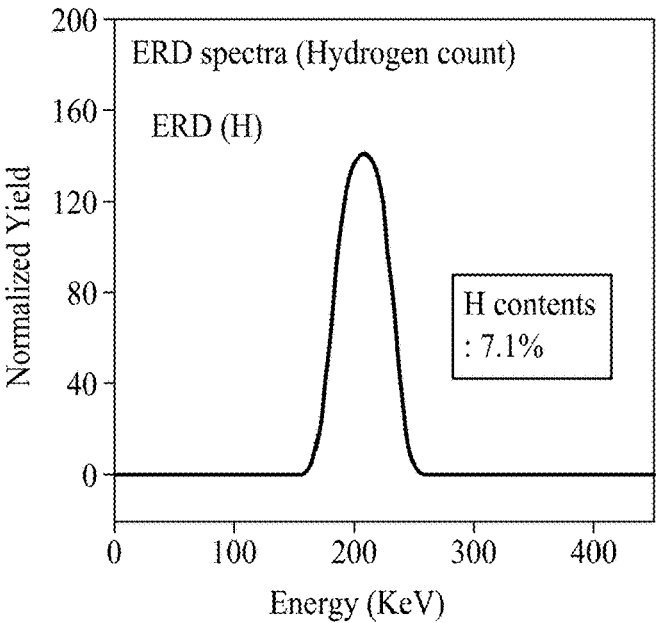
FIG. 12 is an ERD (Elastic Recoil Detection) analysis graph of silicon nitride formed according to an embodiment of the present disclosure.

FIG. 10 is a RBS (Rutherford Backscattering Spectrometry) analysis graph of silicon nitride formed according to an embodiment of this invention, which analyzes the content of N, O, and C relative to silicon. and FIG. 11 is a TOF (time of flight)-ERD (Elastic Reclamation Detection) graph of silicon nitride formed according to an embodiment of present disclosure. and FIG. 12 is an ERD (Elastic Recoil Detection) analysis graph of silicon nitride formed according to an embodiment of the present invention.

FIGS. 10 to 12 relate to a silicon nitride prepared at 200° C. using diisopropylamino silane (DIPAS) gas as a source gas and nitrogen gas as a reactant gas in the process according to FIG. 3.

Referring to FIG. 10 and FIG. 11, it may be seen that silicon nitride is easily prepared because Si and N are included in the prepared material.

Referring to FIG. 12, when the content of hydrogen in the prepared silicon nitride is converted, it may be seen that about 7.1 atomic %, and 8 atomic % or less of hydrogen is included in the silicon nitride.

Figure 13A:
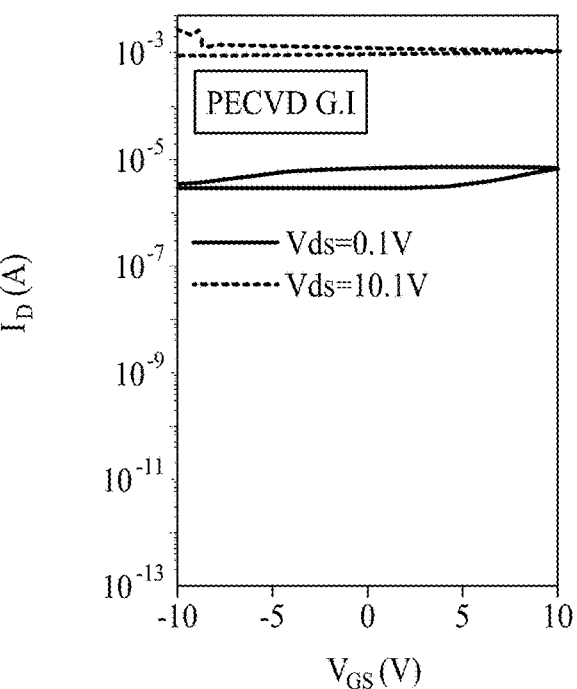
FIG. 13*a* is a graph showing V-I characteristics of a thin film transistor in which silicon nitride manufactured by plasma enhanced chemical vapor deposition (PECVD) is applied as a gate insulating film.
Figure 13B:
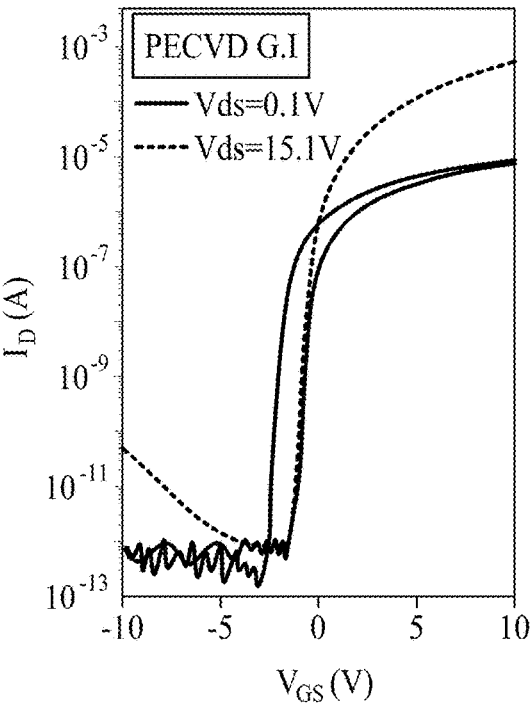
FIG. 13*b* is a graph showing VI characteristics of a silicon nitride manufactured by plasma enhanced atomic layer deposition (PEALD) as an insulating film.

FIG. 13*a* is a graph showing V-I characteristics of a thin film transistor in which silicon nitride manufactured by plasma enhanced chemical vapor deposition (PECVD) is applied as a gate insulating film, and FIG. 13*b* is a graph showing V-I characteristics of a silicon nitride manufactured by plasma enhanced atomic layer deposition (PEALD) as a gate insulating film.

Referring to FIG. 13A, when the silicon nitride made of PECVD is applied, a large amount of hydrogen penetrates into the active layer of the thin film transistor to form an excessive amount of electron carrier, so that the thin film transistor cannot be used as a switch device. Although not shown, it may be seen that the hydrogen content in the silicon nitride prepared with PECVD according to FIG. 13A is about 20 atom %, which is nearly three times greater than the hydrogen content of about 7.1 atom % in the silicon nitride prepared according to an embodiment of the present disclosure.

On the other hand, as shown in FIG. 13B, when the silicon nitride prepared by PEALD is applied, a normal V-I curve is shown, and thus it may be seen that the thin film transistor may be easily used as a switch device.

Figure 14:
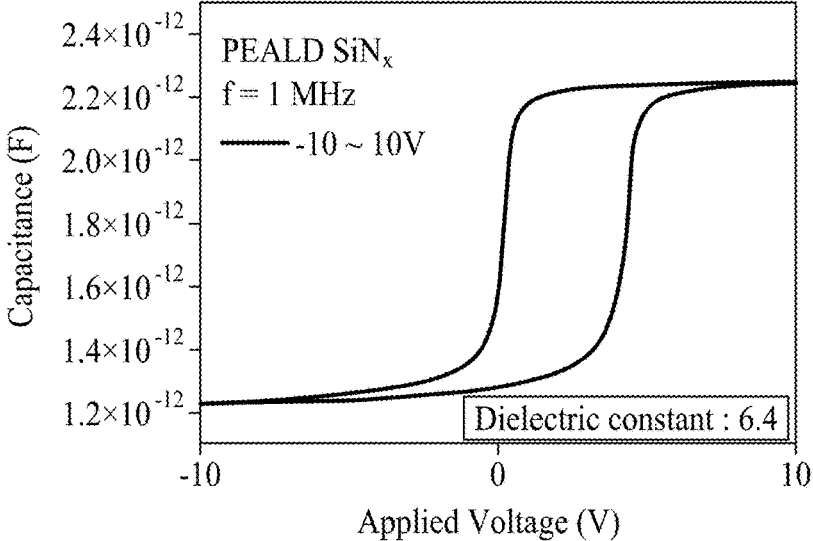
FIG. 14 is a graph illustrating a V-C curve of a thin film transistor in which silicon nitride according to the present disclosure is applied as a gate insulating film.

FIG. 14 is a graph showing a V-C curve of a thin film transistor using silicon nitride as a gate insulating film, and relates to a structure in which silicon nitride is formed between an active layer made of IGZO and a gate electrode made of metal.

Referring to FIG. 14, it can be seen that the capacitance changes to an S-shaped curve as it changes from −10V to 10V, through such a curve, it can be seen that when the dielectric constant of a gate insulating film made of silicon nitride is converted, it has a high dielectric constant characteristic of 6.4.

Figure 15:
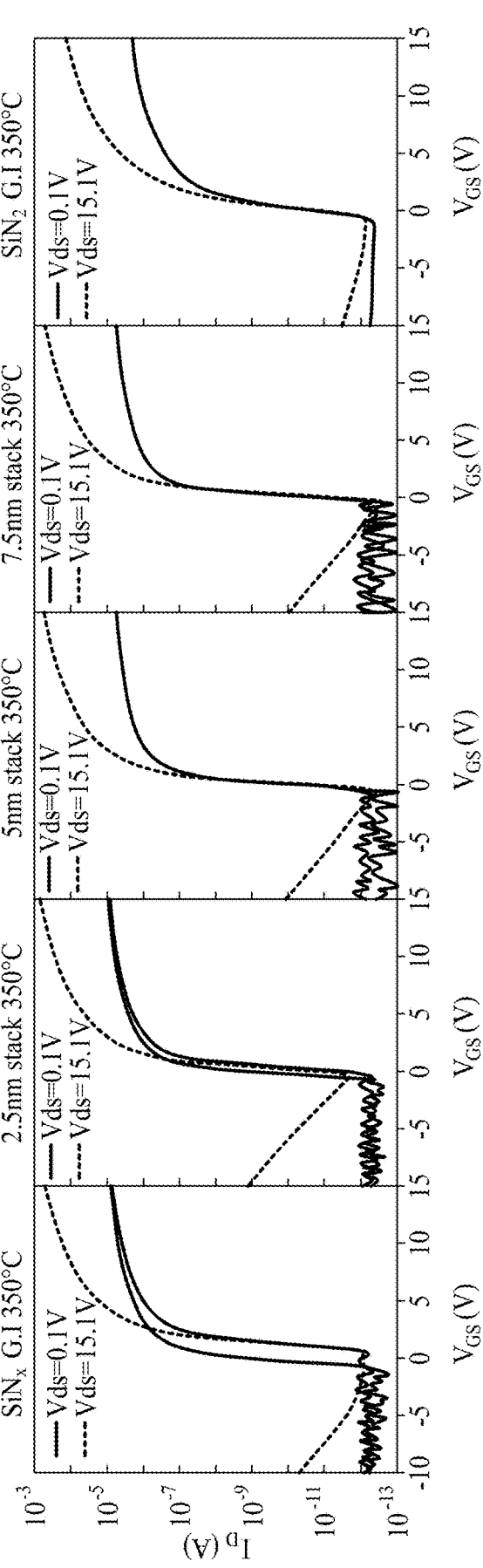
FIG. 15 is a graph showing V-I characteristics according to a driving voltage change of a thin film transistor using a silicon nitride layer according to the present disclosure, a double layer of silicon oxide and silicon nitride, and a conventional silicon oxide layer as a gate insulating film.

FIG. 15 is a graph showing V-I characteristics according to a driving voltage change of a thin film transistor using a monolayer of silicon nitride according to the present disclosure, a double layer of silicon oxide and silicon nitride according to the present disclosure, and a conventional silicon oxide layer as a gate insulating film. In the case of FIG. 15, an IGZO (InGaZnO)-based oxide semiconductor material formed through a MOALD process is used as an active layer, and the same is performed in FIGS. 16 to 18 below.

In FIG. 15, a sample of the leftmost graph relates to a silicon nitride monolayer prepared at 350° C. using diisopropyl amino silane (DIPAS) gas as source gas and nitrogen gas as reactant gas in the process according to FIG. 3, and the thickness of the silicon nitride monolayer is 40 nm.

In FIG. 15, the samples of the second to fourth graphs on the left side are silicon oxide and silicon nitride double layers prepared at 350° C. using diisopropyl amino silane (DIPAS) gas as the first and the second source gas, oxygen gas as the first reactant gas, and nitrogen gas as the second reactant gas, and the thickness of the silicon nitride layer is fixed to 40 nm and the thickness of the silicon oxide layer is changed to 2.5 nm, 5 nm, and 7.7 nm.

A sample of the rightmost graph in FIG. 15 relates to a silicon oxide monolayer prepared at 350° C. using diisopropyl amino silane (DIPAS) gas as source gas and oxygen gas as reactant gas.

FIG. 16 is a table showing various characteristic values of a silicon nitride monolayer according to the present disclosure, a double layer of silicon oxide and silicon nitride according to the present disclosure, and a thin film transistor using the conventional silicon oxide monolayer as a gate insulating film.

In FIG. 16, the silicon nitride monolayer, the double layer of silicon oxide and silicon nitride, and the silicon oxide monolayer are the same as in FIG. 15.

Referring to FIGS. 15 and 16, since the hydrogen content of the silicon nitride monolayer and the double layer of silicon oxide and silicon nitride according to present disclosure is small, it may be seen that it has appropriate Vth and S.S. values for driving the thin film transistor to a degree similar to that of the conventional silicon oxide.

In addition, the dielectric constant of the silicon nitride monolayer according to present disclosure is 6.4 and the dielectric constant of the double layer of silicon oxide and silicon nitride is 6.1 to 6.3, which is higher than 4.0 of the conventional silicon oxide. Accordingly, it may be seen that the carrier mobility (μsat) of the active layer formed of the IGZO (InGaZnO)-based oxide semiconductor material formed through the MOALD process is in the range of 22 to 27 cm2/Vs, which is superior to approximately 18 of the conventional silicon oxide.

It can be found that the dielectric constant increases as the thickness of silicon oxide becomes thinner compared to silicon nitride. Specifically, when the thickness of the silicon oxide with respect to the silicon nitride is greater than 20%, the dielectric constant may be decreased to 6 or less, and the thickness of the silicon oxide with respect to the silicon nitride may be preferably 20% or less.

Also, it can be found that for the double layer of silicon oxide and silicon nitride according to present disclosure, the hysteresis characteristic value is superior to that of the silicon nitride monolayer. That is, as shown in FIG. 16, when the voltage Vds between the source and the drain is 0.1 V, the hysteresis value of the threshold voltage of the thin film transistor to which the double layer of silicon oxide and silicon nitride is applied is approximately ⅓ or less than the hysteresis value of the thin film transistor to which the silicon nitride monolayer is applied. Therefore, considering the hysteresis characteristics, it may be desirable to form a thickness of the silicon oxide to 5% or more compared to the silicon nitride.

Figure 17:
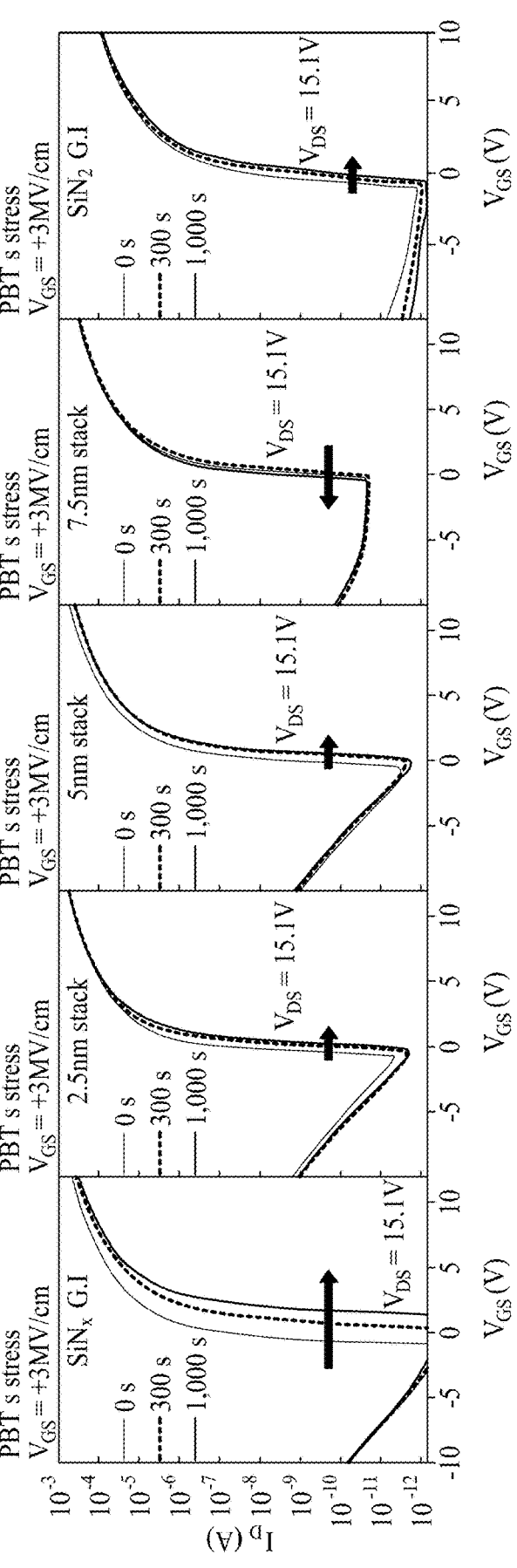
FIG. 17 is a graph showing V-I characteristics over time of a silicon nitride layer according to the present disclosure, a double layer of silicon oxide and silicon nitride, and a thin film transistor using the conventional silicon oxide layer as a gate insulating film.

FIG. 17 is a graph showing V-I characteristics over time of a silicon nitride monolayer according to the present disclosure, a double layer of silicon oxide and silicon nitride according to the present disclosure, and a thin film transistor using the conventional silicon oxide monolayer as a gate insulating film.

FIG. 18 is a table showing various characteristic values of a silicon nitride monolayer according to the present disclosure, a double layer of silicon oxide and silicon nitride according to the present disclosure, and a thin film transistor using the conventional silicon oxide monolayer as a gate insulating film.

In FIGS. 17 and 18, the gate insulating film of each of the samples of the six graphs is the same as the gate insulating film of each of the samples of the six graphs described in FIGS. 15 and 16.

Referring to FIGS. 17 and 18, it may be seen that the double layer of the silicon oxide and the silicon nitride according to the present disclosure may have improved reliability with respect to Vth and S.S. values compared to the case of the silicon nitride monolayer.

Figure 19:
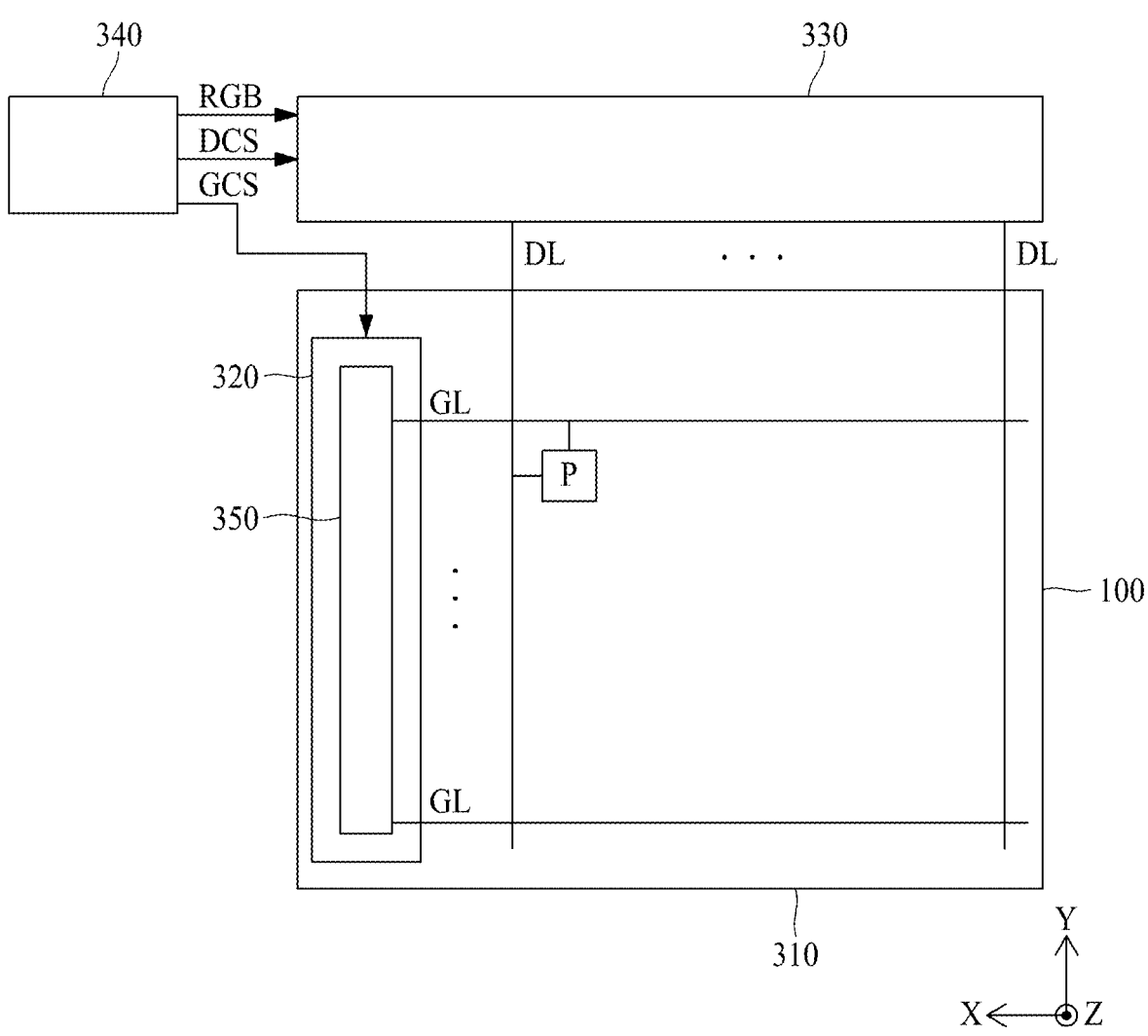
FIG. 19 is a schematic diagram of a display device according to an embodiment of the present disclosure.

FIG. 19 is a schematic diagram of a display apparatus according to an embodiment of the present disclosure.

As shown in FIG. 19, the display apparatus according to an embodiment of the present disclosure may include a display panel 310, a gate driver 320, a data driver 330, and a controller 340.

The display panel 310 includes gate lines GLs and data lines DLs, and pixels P are disposed in respective crossing areas of the gate lines GLs and data lines DLs. An image is displayed by driving the pixel P. The gate lines GLs, the data lines DLs, and the pixels P may be disposed on the substrate 100.

The controller 340 controls the gate driver 320 and the data driver 330. The controller 340 outputs a gate control signal GCS for controlling the gate driver 320 and a data control signal DCS for controlling the data driver 330 by using a signal supplied from an external system (not shown). Also, the controller 340 samples input video data input from the external system and rearranges the sampled input video data, and supplies the rearranged digital video data RGB to the data driver 330.

The gate control signal GCS includes a gate start pulse GSP, a gate shift clock GSC, a gate output enable signal GOE, a start signal Vst, and a gate clock GCLK. Further, control signals for controlling a shift register may be included in the gate control signal GCS.

The data control signal DCS includes a source start pulse SSP, a source shift clock signal SSC, a source output enable signal SOE, and a polarity control signal POL.

The data driver 330 supplies a data voltage to the data lines DL of the display panel 310. Specifically, the data driver 330 converts the video data RGB inputted from the controller 340 into an analog data voltage and supplies the data voltage to the data lines DL.

The gate driver 320 may be mounted on the display panel 310. As described above, a structure in which the gate driver 320 is directly mounted on the display panel 310 is referred to as a gate in panel (GIP) structure. Specifically, in the gate-in-panel (GIP) structure, the gate driver 320 may be disposed on the substrate 100.

The gate driver 320 may include a shift register 350.

The shift register 350 sequentially supplies gate pulses to the gate lines GL during one frame by the use of start signal and gate clock transmitted from the controller 340. Herein, the one frame refers to a period in which one image is outputted through the display panel 310. The gate pulse has a turn-on voltage capable of turning on a switching device (thin film transistor) disposed in the pixel P.

Also, during the remaining period of one frame, in which the gate pulse is not supplied, the shift register 350 supplies a gate-off signal capable of turning off the switching device to the gate line GL. Hereinafter, the gate pulse and the gate-off signal are totally referred to as a scan signal GS.

Figure 20:
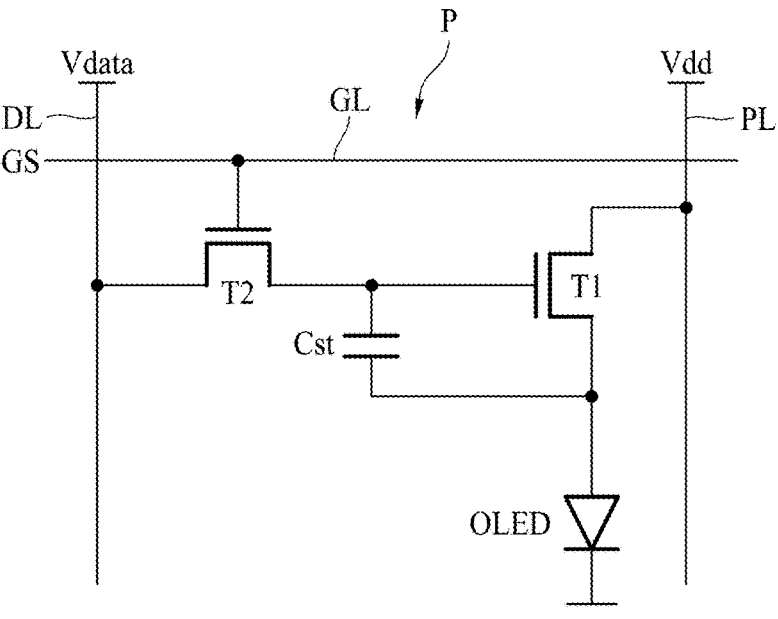
FIG. 20 is a circuit diagram of one pixel provided in a display device according to an embodiment of the present disclosure.

FIG. 20 is a circuit diagram of one pixel provided in a display apparatus according to an embodiment of the present disclosure.

As shown in FIG. 20, the display apparatus according to an embodiment of present disclosure includes first to second thin film transistors T1 and T2 and capacitors Cst.

The first thin film transistor T1 is a driving thin film transistor, and the second thin film transistor T2 is a switching thin film transistor. At least one of the first thin film transistor T1 and the second thin film transistor T2 may be formed of the above-described various thin film transistors.

The first thin film transistor T1 is switched according to the data voltage Vdata supplied from the second thin film transistor T2, generates a data current from the driving voltage VDD supplied from the power line PL, and supplies it to the organic light emitting diode OLED.

The second thin film transistor T2 is switched according to the gate signal GS supplied to the gate line GL and supplies the data voltage Vdata supplied from the data line DL to the first thin film transistor T1.

The capacitor Cst serves to maintain the data voltage supplied to the first thin film transistor T1 for one frame, and is provided between the gate electrode and the source electrode of the first thin film transistor T1.

The organic light emitting diode OLED emits predetermined light according to a data current supplied from the first thin film transistor T1.

Figure 21:
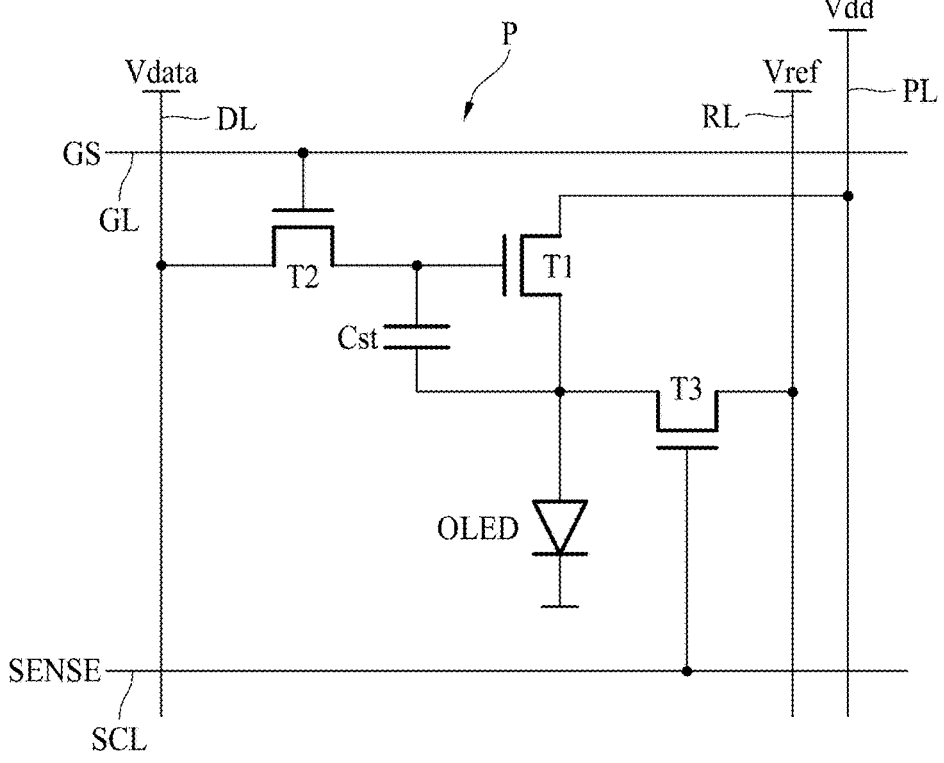
FIG. 21 is a circuit diagram of one pixel provided in a display device according to another embodiment of the present disclosure.

FIG. 21 is a circuit diagram of one pixel provided in a display apparatus according to another embodiment of the present disclosure.

As shown in FIG. 21, the display apparatus according to another embodiment of present disclosure includes first to third thin film transistors T1, T2, T3 and a capacitor Cst.

The first thin film transistor T1 is a driving thin film transistor, and the second to third thin film transistors T2 to T3 are switching thin film transistors. At least one of the first to third thin film transistors T1, T2, and T3 may be formed of the above-described various thin film transistors.

The first thin film transistor T1 is switched according to the data voltage Vdata supplied from the second thin film transistor T2, generates a data current from the driving voltage VDD supplied from the power line PL, and supplies it to the organic light emitting diode OLED.

The second thin film transistor T2 is switched according to the gate signal GS supplied to the gate line GL and supplies the data voltage Vdata supplied from the data line DL to the first thin film transistor T1.

The third thin film transistor T3 supplies the current of the first thin film transistor T1 to the reference line RL in response to the sensing control signal SENSE supplied from the scan line SCL. A reference voltage Vref is supplied to the reference line RL.

The capacitor Cst serves to maintain the data voltage supplied to the first thin film transistor T1 for one frame, and is provided between the gate electrode and the source electrode of the first thin film transistor T1.

The organic light emitting diode OLED emits predetermined light according to a data current supplied from the first thin film transistor T1.

Figure 22:
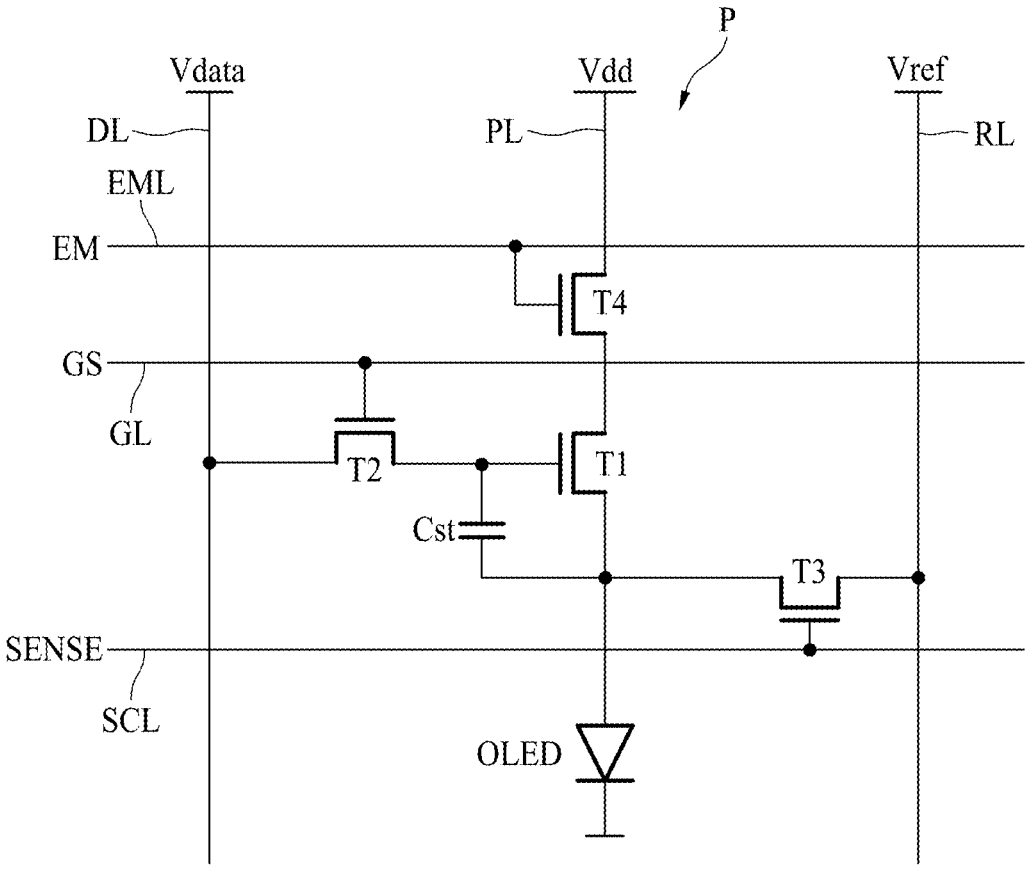
FIG. 22 is a circuit diagram of one pixel provided in a display device according to another embodiment of the present disclosure.

FIG. 22 is a circuit diagram of one pixel provided in a display apparatus according to another embodiment of the present disclosure.

As shown in FIG. 22, the display apparatus according to another embodiment of the present disclosure includes first to fourth thin film transistors T1, T2, T3, and T4 and a capacitor Cst.

The first thin film transistor T1 is a driving thin film transistor, and the second to fourth thin film transistors T2 to T4 are switching thin film transistors. At least one of the first to fourth thin film transistors T1, T2, T3, and T4 may be formed of the above-described various thin film transistors.

The first thin film transistor T1 is switched according to the data voltage Vdata supplied from the second thin film transistor T2, generates a data current from the driving voltage VDD supplied from the power line PL, and supplies it to the organic light emitting diode OLED.

The second thin film transistor T2 is switched according to the gate signal GS supplied to the gate line GL and supplies the data voltage Vdata supplied from the data line DL to the first thin film transistor T1.

The third thin film transistor T3 supplies the current of the first thin film transistor T1 to the reference line RL in response to the sensing control signal SENSE supplied from the scan line SCL. A reference voltage Vref is supplied to the reference line RL.

The fourth thin film transistor T4 is switched according to the light emission control signal EM supplied to the light emission control line EML and supplies the driving voltage VDD supplied from the power line PL to the first thin film transistor T1.

The capacitor Cst serves to maintain the data voltage supplied to the first thin film transistor T1 for one frame, and is provided between the gate electrode and the source electrode of the first thin film transistor T1.

The organic light emitting diode OLED emits predetermined light according to a data current supplied from the first thin film transistor T1.

Accordingly, the present disclosure may have the following advantages.

According to an embodiment of the present disclosure, since the gate insulating film includes a material having a high dielectric constant, a relatively high driving current value can be obtained even at a low voltage, and thus it can be easily used as a switching device for a high-resolution display for driving a low voltage.

According to an embodiment of the present disclosure, since the gate insulating film includes a material having a low hydrogen content, in the subsequent process, a problem of hydrogen penetrating into the active layer and forming an excessive amount of electron carriers in the active layer may be prevented.

According to an embodiment of the present disclosure, since a gate insulating film with a high dielectric constant and a low hydrogen content is formed by plasma enhanced atomic layer deposition (PEALD), it has high density characteristics and low internal defect state, so the film quality of the gate insulating film is excellent.

According to an embodiment of the present disclosure, the gate insulating film includes a second gate insulating film including silicon oxide and a first gate insulating film including silicon nitride, thereby effectively improving hysteresis properties and reliability of the thin film transistor without significantly reducing dielectric constant.

It will be apparent to those skilled in the art that various modifications and variations can be made in the thin film transistor substrate and the display apparatus comprising the same of the present disclosure without departing from the technical idea or scope of the disclosure. Thus, it is intended that the present disclosure cover the modifications and variations of this disclosure provided they come within the scope of the appended claims and their equivalents.

18

What is claimed is:

1. A thin film transistor substrate, comprising:
a substrate;
an active layer and a gate electrode on the substrate, the active layer and gate electrode being spaced apart from each other vertically;
a gate insulating film including a first gate insulating film and a second gate insulating film provided between the active layer and the gate electrode; and
a source electrode and a drain electrode, each of the source electrode and the drain electrode connected to the active layer,
wherein the first gate insulating film is provided closer to the gate electrode than the second gate insulating film,
wherein a dielectric constant of the first gate insulating film is higher than a dielectric constant of the second gate insulating film,
wherein the first gate insulating film includes silicon nitride formed by plasma-enhanced atomic layer deposition, and the second gate insulating film includes silicon oxide formed by plasma-enhanced atomic layer deposition, and
wherein a hydrogen content of the second gate insulating film at a lower portion of the gate insulating film including the silicon oxide and closer to the active layer is lower than a hydrogen content of the first gate insulating film at an upper portion of gate insulating film including the silicon nitride.

2. The thin film transistor substrate according to claim 1, wherein a thickness of the second gate insulating film is in the range of 5% or more and 20% or less than a thickness of the first gate insulating film.

3. The thin film transistor substrate according to claim 1, wherein the plasma-enhanced atomic layer deposition is performed using diisopropyl amino silane gas as a source gas.

4. The thin film transistor substrate according to claim 1, wherein the silicon oxide is formed by repeatedly performing a first cycle of supplying diisopropylamino silane gas as a first source gas, supplying a first purge gas, supplying a first reactant gas including oxygen with plasma, and supplying a second purge gas into a vacuum chamber, and
wherein the silicon nitride is formed by repeatedly performing a second cycle of supplying diisopropylamino silane gas as a second source gas, supplying a third purge gas, supplying a second reactant gas including nitrogen with plasma, and supplying a fourth purge gas into the vacuum chamber.

5. The thin film transistor substrate according to claim 1, wherein the active layer includes an IGZO-based oxide semiconductor formed by a metal organic atomic layer deposition, and a carrier mobility of the active layer is in the range of 22 cm$^2$/Vs to 27 cm$^2$/Vs.

6. The thin film transistor substrate according to claim 1, wherein a dielectric constant of the gate insulating film is in the range of 6.1 to 6.3.

7. The thin film transistor substrate according to claim 1, wherein the hydrogen content of the first gate insulating film is 8 atomic % or less.

8. The Thin film transistor substrate according to claim 1, wherein the dielectric constant of the first gate insulating film is in the range of 6.0 to 7.5.

9. A thin film transistor substrate, comprising:
a substrate;
an active layer and a gate electrode on the substrate, the active layer and gate electrode being spaced apart from each other vertically;
a gate insulating film provided between the active layer and the gate electrode; and a source electrode and a drain electrode, each of the source electrode and the drain electrode connected to the active layer, wherein the gate insulating film includes silicon nitride and silicon oxide formed by plasma-enhanced atomic layer deposition using diisopropyl amino silane gas as a source gas such that a hydrogen content of a lower portion of the gate insulating film including the silicon oxide and closer to the active layer is lower than a hydrogen content of an upper portion of gate insulating film including the silicon nitride.

10. The thin film transistor substrate according to claim 9, wherein the silicon nitride is formed by repeatedly performing one cycle of supplying the diisopropyl amino silane gas as a source gas, supplying a first purge gas, supplying a reactant gas containing nitrogen with plasma, and supplying a second purge gas into a vacuum chamber.

11. The thin film transistor substrate according to claim 9, wherein the active layer includes an IGZO-based oxide semiconductor formed by a metal organic atomic layer deposition, and wherein a carrier mobility of the active layer is in the range of 22 cm$^2$/Vs to 27 cm$^2$/Vs.

12. The thin film transistor substrate according to claim 9, wherein a dielectric constant of the gate insulating film is in the range of 6 to 7.5.

13. The thin film transistor substrate according to claim 9, wherein the gate insulating film has a hydrogen content of 8 atomic % or less.

14. A display apparatus comprising a thin film transistor substrate, wherein the thin film transistor substrate comprises:

a substrate;

an active layer and a gate electrode on the substrate, the active layer and gate electrode being spaced apart from each other vertically;

a gate insulating film including a first gate insulating film and a second gate insulating film provided between the active layer and the gate electrode; and a source electrode and a drain electrode, each of the source electrode and the drain electrode connected to the active layer, wherein the first gate insulating film is provided closer to the gate electrode than the second gate insulating film, wherein a dielectric constant of the first gate insulating film is higher than a dielectric constant of the second gate insulating film, wherein the first gate insulating film includes silicon nitride formed by plasma-enhanced atomic layer deposition, and the second gate insulating film includes silicon oxide formed by plasma-enhanced atomic layer deposition, and wherein a hydrogen content of the second gate insulating film at a lower portion of the gate insulating film including the silicon oxide and closer to the active layer is lower than a hydrogen content of the first gate insulating film at an upper portion of gate insulating film including the silicon nitride.

15. The display apparatus according to claim 14, wherein a thickness of the second gate insulating film is in the range of 5% or more and 20% or less than a thickness of the first gate insulating film.

16. The display apparatus according to claim 14, wherein the active layer includes an IGZO-based oxide semiconductor formed by a metal organic atomic layer deposition, and a carrier mobility of the active layer is in the range of 22 cm$^2$/Vs to 27 cm$^2$/Vs.

17. The display apparatus according to claim 14, wherein a dielectric constant of the gate insulating film is in the range of 6.1 to 6.3.

18. The display apparatus according to claim 14, wherein the hydrogen content of the first gate insulating film is 8 atomic % or less.

19. The display apparatus according to claim 14, wherein the dielectric constant of the first gate insulating film is in the range of 6.0 to 7.5.

* * * * *